United States Patent [19]

Goenka

[11] Patent Number: 5,405,283

[45] Date of Patent: Apr. 11, 1995

[54] $CO_2$ CLEANING SYSTEM AND METHOD

[75] Inventor: Lakhi N. Goenka, Ann Arbor, Mich.

[73] Assignee: Ford Motor Company, Dearborn, Mich.

[21] Appl. No.: 148,222

[22] Filed: Nov. 8, 1993

[51] Int. Cl.$^6$ .............................................. B24B 1/00
[52] U.S. Cl. ........................................ 451/39; 451/36; 451/40; 451/91; 451/90; 451/102
[58] Field of Search ................. 51/317, 319, 320, 321, 51/426, 427, 428, 439; 451/36, 38, 39, 40, 89, 90, 91, 102

[56] References Cited

U.S. PATENT DOCUMENTS

| | | |
|---|---|---|
| 2,666,279 | 1/1954 | Chalom . |
| 3,878,978 | 4/1975 | Martinke . |
| 3,982,605 | 9/1976 | Sneckenberger ................ 181/47 B |
| 4,308,786 | 8/1977 | Fong . |
| 4,519,812 | 5/1985 | Brull et al. . |
| 4,631,250 | 12/1986 | Hayashi . |
| 4,747,421 | 5/1988 | Hayashi ............................. 134/201 |
| 4,806,171 | 2/1989 | Whitlock et al. . |
| 4,828,184 | 5/1989 | Gardner et al. . |
| 4,932,168 | 6/1990 | Tada et al. ........................... 51/436 |
| 4,962,891 | 10/1990 | Layden . |
| 5,018,667 | 5/1991 | Lloyd ................................... 51/320 |
| 5,111,984 | 5/1992 | Niedbala . |

FOREIGN PATENT DOCUMENTS 8900809 11/1990 Netherlands .

Primary Examiner—Bruce M. Kisliuk
Assistant Examiner—Eileen Morgan
Attorney, Agent, or Firm—Richard D. Dixon; Roger L. May

[57] ABSTRACT

A nozzle expels liquid $CO_2$ through an orifice for converting the liquid into $CO_2$ snow. The nozzle is contained within an elongated cavity within a body which in turn is coupled to an exhaust nozzle for directing the $CO_2$ snow toward a workpiece. A mixing device is provided for receiving and mixing pressurized air at ambient temperature with liquid nitrogen for precooling the air and then directing the resulting mixture of gases into the cavity and toward the nozzle. In this manner, the precooled shop air will enhance the efficiency of the conversion of the liquid $CO_2$ into $CO_2$ snow particles.

17 Claims, 3 Drawing Sheets

$CO_2$ CLEANING SYSTEM AND METHOD

FIELD OF THE INVENTION

The present invention relates to an apparatus and method for creating abrasive $CO_2$ snow at supersonic speeds and for directing the snow onto an area of contaminants to be removed from a workpiece.

BACKGROUND OF THE INVENTION

The use of liquid carbon dioxide for producing $CO_2$ snow and subsequently accelerating it to high speeds for cleaning particles from a substrate is taught by Layden in U.S. Pat. No. 4,962,891. A saturated $CO_2$ liquid having an entropy below 135 BTU per pound is passed though a nozzle for creating, through adiabatic expansion, a mix of gas and $CO_2$ snow. A series of chambers and plates are used to enhance the formation of larger droplets of liquid $CO_2$ that are then converted through adiabatic expansion into solid $CO_2$ snow. The walls of the ejection nozzle are suitably tapered at an angle less than 15 degrees so that the intensity or focus of the stream of the solid/gas $CO_2$ will not be reduced below that which is necessary to clean the workpiece. The nozzle, which may be manufactured of fused silica or quartz, does not utilize any precooling.

Lloyd, in U.S. Pat. No. 5,018,667 at columns 5 and 7, teaches the use of multiple nozzles and tapered concentric orifices for controlling the flow of the $CO_2$ and snow mixture. These references seek to disperse the snow rather than to focus it after exiting the exhaust nozzle. Lloyd teaches that a small portion of the liquid $CO_2$ is routed through a pilot orifice and then into an expansion cavity for allowing the liquid $CO_2$ to flash from the liquid to the solid state, which in turn causes a significant drop in temperature. This cooled mixture of solid, liquid and gas cools the inside surface of the nozzle, which then cools the remainder of the nozzle through conduction. This cooling acts as a constant temperature heat sink that precools the liquid $CO_2$ as it enters the primary orifices in the body, which in turn enhances the conversion of the main flow of the liquid $CO_2$ flowing through the primary orifices of the nozzle. No precooling gasses are used in the vicinity of the nozzle to improve the flashing conversion of the liquid into the solid phase.

Hayashi, in U.S. Pat. Nos. 4,631,250 and 4,747,421, discloses the use of liquified nitrogen ($N_2$) for cooling a jacket-type peripheral wall defining a sealed cavity in which a flow of $CO_2$ gas is introduced under pressure. The cooling produced by the cooled peripheral walls causes the $CO_2$ to change into snow within the chamber. $N_2$ gas is introduced into the chamber at high pressure in order to agitate and carry the $CO_2$ snow from the chamber at high velocity though a jetting nozzle. While liquid $N_2$ is used for cooling the peripheral walls, the ambient $N_2$ is used only for agitating and transporting the $CO_2$ snow from the cooled cavity.

In contrast to these prior art teachings, the present invention utilizes inexpensive components and readily available low pressure shop air for improving the efficiency of creating $CO_2$ snow and for improving the coagulation of the $CO_2$ snow into larger $CO_2$ snow particles. It is therefore an object of the present invention to utilize shop air which is introduced into an elongated expansion area adjacent to the direct conversion liquid $CO_2$ snow nozzle, and produce moderate size snow particles suitable for agglomeration into larger $CO_2$ particles by controlling the pressure and temperature of the shop air. The shop air may be precooled by the injection of relatively small volumes of liquid $N_2$ to precool low pressure shop air that then is introduced into the expansion area adjacent the nozzle in order to improve the efficiency of the flash conversion of liquid $CO_2$ into snow. The shop air cooled by the injection of the liquid $N_2$ also flows across and cools the nozzle for improving the efficiency of the direct flash conversion of the $CO_2$ from liquid to solid.

SUMMARY OF THE INVENTION

In an apparatus for cleaning a workpiece with abrasive $CO_2$ snow, a nozzle is provided for receiving and expelling liquid $CO_2$ through an orifice sized for converting the liquid into $CO_2$ snow. A body, defining a cavity therein, is coupled to the nozzle such that the snow is ejected into the cavity. An exhaust nozzle is coupled to the body and the cavity therein for directing the pressurized $CO_2$ snow toward the workpiece. A mixing device is coupled to the nozzle for receiving and mixing pressurized shop air and liquid nitrogen, and then directing the cooled shop air into the cavity for cooling the area adjacent to the nozzle. In this manner, the precooled shop air enhances the efficiency of the conversion of liquid $CO_2$ into $CO_2$ snow particles by cooling and pressurizing the area adjacent to the orifices in the nozzle within the cavity.

BRIEF DESCRIPTION OF THE DRAWINGS

Other objects, features and advantages of the present invention will be apparent from a study of the written descriptions and the drawings in which.

DESCRIPTION OF THE PREFERRED EMBODIMENT AND METHOD

Figure 1:
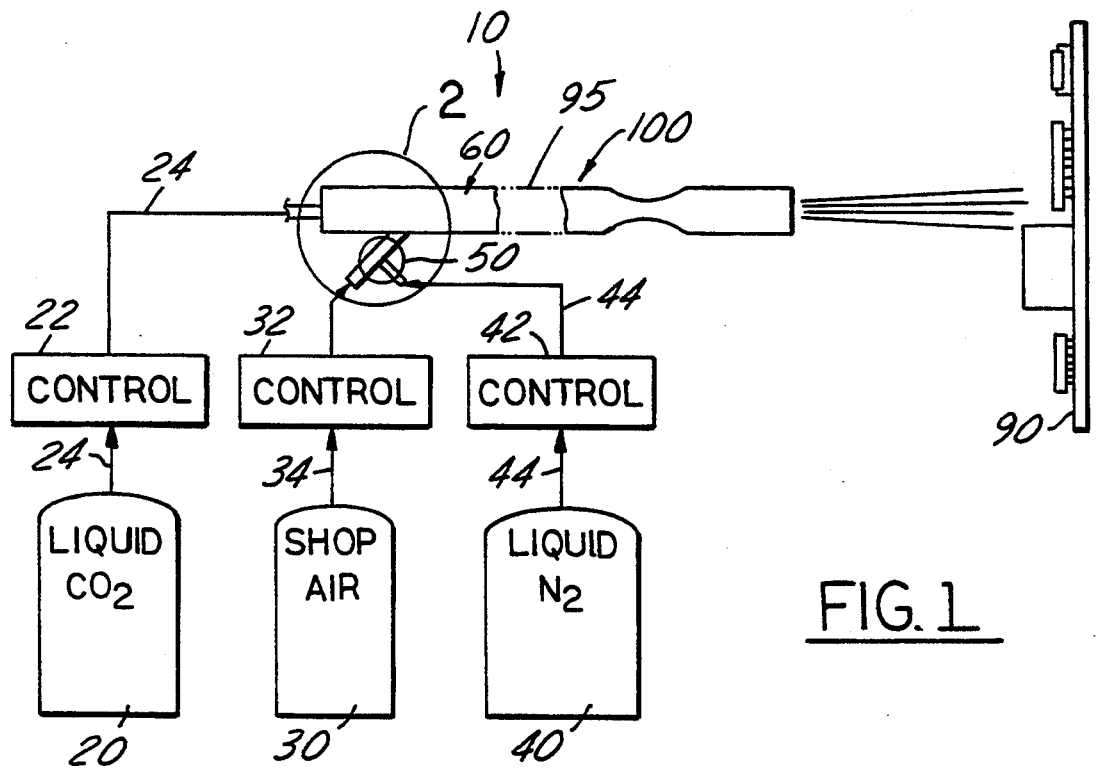
FIG. 1 is a pictorial diagram of the $CO_2$ cleaning system in accordance with the present invention as it operates on a printed circuit board workpiece.

A $CO_2$ cleaning system in accordance with the present invention is illustrated generally in FIG. 1. A $CO_2$ snow generator 10 is connected to a reservoir 20 of liquid $CO_2$, a source of compressed shop air 30 and a source of liquid nitrogen $N_2$ 40. The solid $CO_2$ snow which is exhausted from the exhaust nozzle of the $CO_2$ generator 10 is focused on the workpiece 90 shown generally as a printed circuit board of the type having electronic components mounted thereon. The size of the workpiece is enlarged for purposes of clarity and does not necessarily represent the size of the $CO_2$ footprint on the PC board or other workpiece to be cleaned The reservoir 20 of liquid $CO_2$ is stored at approximately 0° F. and is pumped under a pressure of approximately 300–400 psi through line 24, and through a control valve 22 and then into the $CO_2$ snow generator 10. The control valve 22 regulates the pressure and the flow rate under which the liquid $CO_2$ is fed into the $CO_2$ snow generator 10, which in turn regulates the amount of snow in the output.

The source of "shop air" 30 generally comprises an air compressor and reservoir of the type normally found in a manufacturing or production environment. The air compressor is capable of pumping a large volume of air, typically 200 cfm at room temperature, through a feedline 34. A control valve 32 is interposed along the feedline 34 for regulating the pressure and flow rate of the air from the shop air 30. The use of existing shop air in the pressure range of 50 psi to 100 psi significantly reduces the initial capital cost of the present system.

A reservoir 40 of liquid nitrogen ($N_2$) is coupled through a supply line 44 into a mixer 50 that allows the liquid nitrogen to be injected into the flow of shop air as required for proper performance of the system. A control valve 42 is inserted into the liquid nitrogen line 44 for controlling the pressure and volume of the liquid nitrogen that mixes with and therefore cools the shop air in the mixer 50. As illustrated generally in FIG. 2, the mixer 50 can be constructed by merely inserting the line 44 carrying the liquid nitrogen into the line 34 transporting the shop air from the reservoir 30 into the $CO_2$ snow generator nozzle, illustrated generally as 60.

Figure 2:
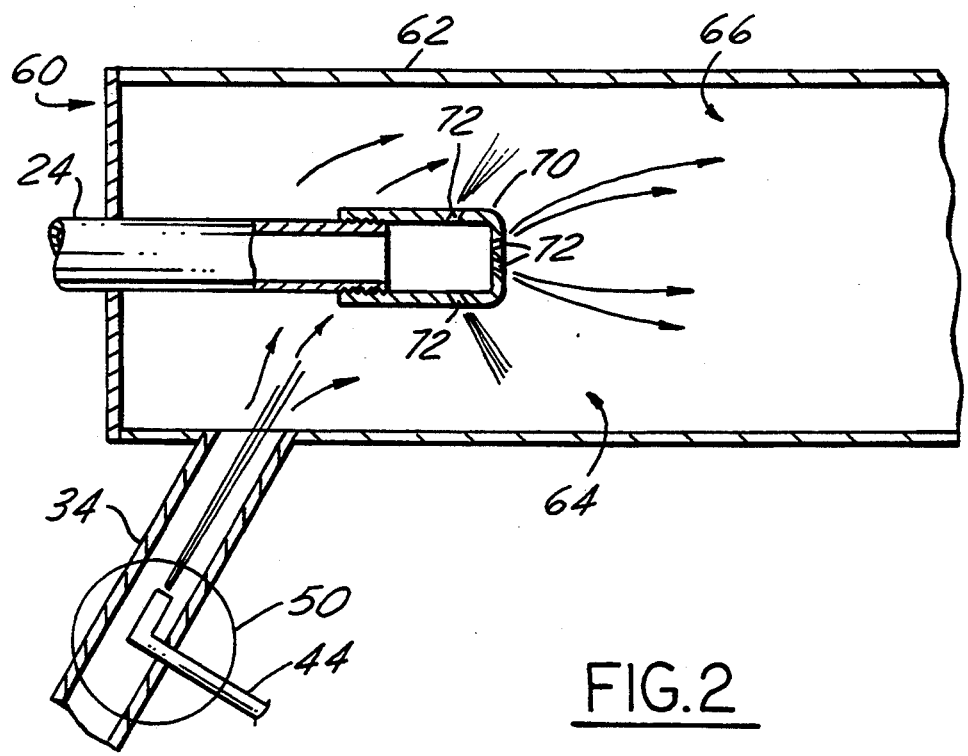
FIG. 2 is a cross-section view of the first preferred embodiment of the $CO_2$ generator nozzle in accordance with the present invention that is contained within the circled portion of FIG. 1 identified with the reference numeral 2.

With continuing reference to FIG. 2, the $CO_2$ snow generator nozzle 60 includes a body 62 having a generally cylindrical shape and defining therein a body cavity 64 having a diameter of approximately 1 to 4 inches, with 4 inches being used in the preferred embodiment, in which the $CO_2$ snow is generated. The cavity 64 is at least 10 to 15 diameters long, which provides a sufficiently restricted volume in which the $CO_2$ snow particles can coagulate to form larger $CO_2$ particles.

The line 24 carrying the liquid $CO_2$ from the reservoir 20 is coupled through the closed end of the body 62 and extends into the body cavity 64 by approximately 4 inches. The body 62 is sealed with the line 24 to allow pressure to accumulate within the body cavity 64. An injector nozzle 70 is coupled to the distended end of the line 24 carrying the liquid $CO_2$. A plurality of orifices 72 are arranged generally around the circumference and on the end of the injector nozzle 70. Whereas the inside diameter of the injector nozzle 70 is approximately $\frac{1}{2}$ inch, the orifices 72 are only 0.04 inches in diameter. The orifices generally comprise bores or channels into the nozzle 70 that are angled with respect to the longitudinal axis of the nozzle 70 and the cavity 64 so that when the liquid $CO_2$ is expelled through the orifices 72, the snow will have some forward velocity toward the elongated section of the cavity 64. The exact angle at which the $CO_2$ snow is expelled through the orifices 72 will vary by design, but in the preferred embodiment is between approximately 30 degrees and 60 degrees with respect to the longitudinal axis.

With continuing reference to FIG. 2, the shop air line 34 from the mixer 50 is coupled into the body 62 of the $CO_2$ snow generator nozzle 60 at a point generally between the closed end of the body and the orifices 72 in the injector nozzle 70. The angle at which the line 34 is coupled into the body 62 not only provides a forward momentum for the shop air as it is introduced under pressure into the cavity 64, but the location and angle of the line 34 with respect to the body 62 also cause the shop air to be directed toward the injector nozzle 70.

The inside diameter of the shop air line 34 is approximately 1.25 inches, which in the preferred embodiment is appropriate to provide the volume of shop air to propel the $CO_2$ snow from the system with the appropriate velocity.

The method of operation of the $CO_2$ snow generator 10 will now be explained with continuing reference to FIG. 2. The liquid $CO_2$ is pumped from the reservoir 20 through the feedline 24 under a pressure controlled by the control valve 22. The liquid $CO_2$ is forced under pressure through the orifices 72 in the injector nozzle 70 and thereby "flashes" from the liquid state into a state that includes a solid form of $CO_2$, which herein is referred to generally as $CO_2$ snow. The $CO_2$ snow will be mixed with either liquid $CO_2$ or $CO_2$ in the gaseous form depending on the combination of temperature and pressure as illustrated in the enthalpy diagram of FIG. 4. In the preferred mode of operation, the liquid $CO_2$ will have a temperature of approximately 0° F. and will be pumped through the orifices 72 in the injector nozzle 70 under a pressure of approximately 300 psi. This combination of characteristics is illustrated as point 1 in the enthalpy diagram of FIG. 4. As the liquid $CO_2$ exits the orifices 72, it will move to point 2A on the enthalpy diagram. It will be understood by one skilled in the art that point 2A may be transferred into the area in which the exiting $CO_2$ is in the solid and gaseous phase by increasing the pressure of the gas within the cavity 64 to point 2C, where the exiting $CO_2$ is in the solid and liquid phases, by decreasing the temperature of the gas within the cavity 64.

Both of these objectives may be accomplished by either controlling the pressure of the shop air flowing through line 34, or by injecting a controlled volume of liquid nitrogen through the mixer 50 into the shop air to carefully control the resulting temperature of the mixture of gases, or by doing both. Assuming that liquid nitrogen at a temperature of −450° F. is injected into the mixer 50 in a ratio of 15 parts of gaseous nitrogen to 85 parts of air, the shop air at a pressure of 80 psi can be precooled to a temperature in the range of −40° F. to −120° F. As this precooled mixture of shop air and nitrogen is directed toward the nozzle 70, point 2A on the enthalpy diagram in FIG. 4 moves to point 2C which produces more snow and less liquid $CO_2$.

The precooled air and nitrogen mixture flowing through the line 34 from the mixer 50 will also cool the injector nozzle 70 to remove latent heat generated as the liquid $CO_2$ flashes through the orifices 72 in the injector nozzle. This cooling effect also will improve the efficiency of the conversion of the liquid $CO_2$ to snow. The conversion of part of the liquid $CO_2$ injected into the cavity 64 from the liquid state to the gaseous state also adds additional pressure to the shop air in the body cavity 64. This compensates for system pressure losses and increases the pressure at the inlet to the exhaust nozzle 100 by up to approximately 20 percent. This increases nozzle exit velocities, thereby improving the cleaning efficiency of the process.

Figure 3:
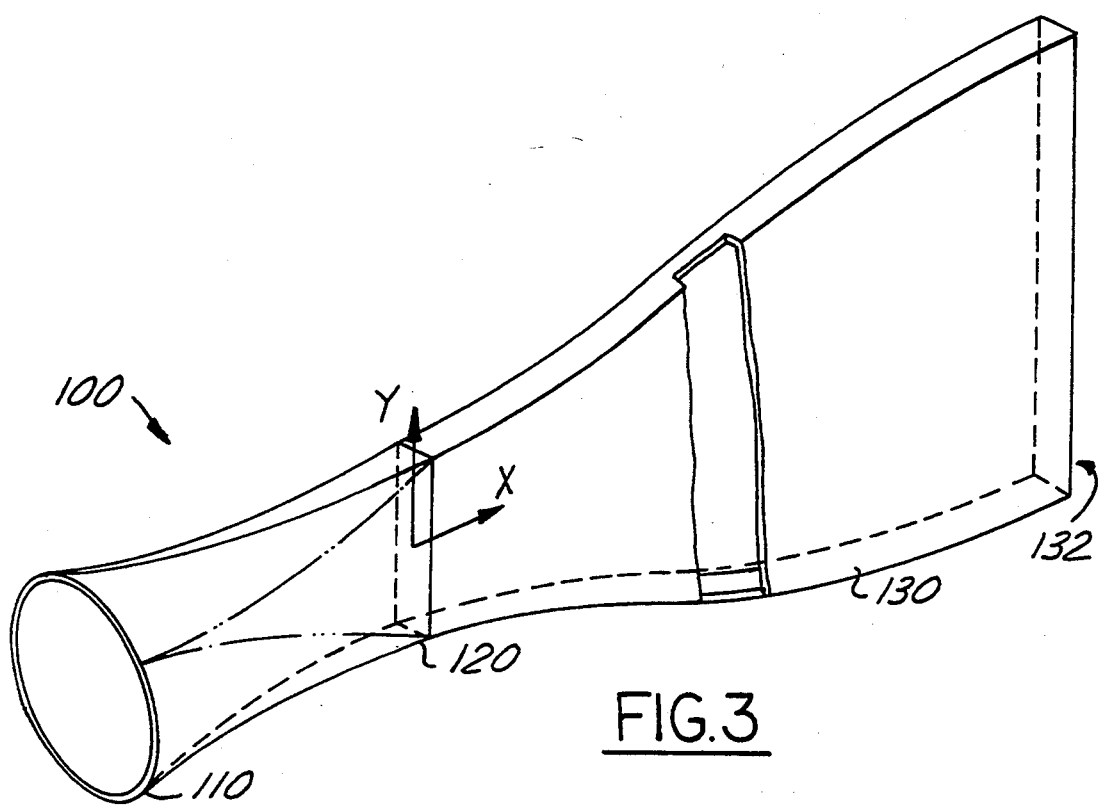
FIG. 3 is a perspective view of a first preferred embodiment of the exhaust nozzle in accordance with the present invention. Hidden lines and cutaway sections reveal the shapes of the interior dimensions of nozzle.

With reference to FIG. 2, the mixture of $CO_2$ snow and gas from the orifices 72 within the injector nozzle 70 are exhausted toward the elongated end 66 of the body cavity 64 within the exhaust gas nozzle 100. The exhaust nozzle 100 expands the stream isentropically to the ambient pressure. Further conversion of any remaining liquid or gaseous $CO_2$ into $CO_2$ snow will occur during this process. As illustrated in FIG. 3, the exhaust nozzle 100 includes a generally cylindrical section 110 that is sized for coupling with the distended section of the body 62 of the $CO_2$ snow generator nozzle 60. This coupling may be accomplished either directly or by the use of a hose 95 of sufficient diameter and length. The cylindrical section 110 is approximately 0.9 inches in inside diameter, and tapers over a length of approximately 6 inches to a throat section 120 that has a generally rectangular cross section approximately 0.9 inches by 0.1 inches. This compound tapering shape between the cylindrical section 110 and the throat section 120 causes a decrease in the pressure of the $CO_2$ snow and gases flowing therethrough. The throat section 120 expands and opens into an enlarged exit nozzle section 130 that defines a generally rectangular exhaust aperture 132 through which the solid $CO_2$ snow and gases flow as they are directed toward the workpiece. The generally cylindrical section 110 of the exhaust nozzle 100 is manufactured of aluminum and is designed to contain and channel a subsonic flow rate of the $CO_2$ gas and snow flowing therethrough. The enlarged exit nozzle 130 is designed to direct a supersonic flow of the $CO_2$ gas and snow from the exhaust aperture 132.

The contour or curvature of the inside surface of the subsonic section 110 of the nozzle 100 is designed according to the matched-cubic design procedure described by Thomas Morel in "Design of 2-D Wind Tunnel Contractions", Journal of Fluids Engineering, 1977, vol. 99. According to this design the gaseous mixture of air and $CO_2$ flows at subsonic speeds of approximately 40 feet per second at the inlet to 1000 feet per second at temperatures of from $-60°$ F. to $-120°$ F. as it converges at the throat section 120.

The contour or curvature of the inside surfaces of tile supersonic section 130 are designed according to a computer program employing the Method of Characteristics as explained by J. C. Sivells in tile article "A Computer Program for the Aerodynamic Design of Axisymmetric and Planar Nozzles for Supersonic and Hypersonic Wind Tunnels", AEDC-JR-78-63, that can be obtained from the U.S. Air Force.

The exact contour of the enlarged exit nozzle section 130 is more particularly defined with reference to the table of dimensions as follows:

| Coordinates of Supersonic Nozzle Contour Throat Height = 0.904 in. Nozzle Depth = 0.1-in. | |
|---|---|
| x (in.) | y (in.) |
| 0.000 | 0.452 |
| 0.178 | 0.452 |
| 0.587 | 0.452 |
| 1.329 | 0.455 |
| 2.181 | 0.461 |
| 3.122 | 0.473 |
| 4.143 | 0.493 |
| 5.236 | 0.521 |
| 6.397 | 0.560 |
| 7.618 | 0.605 |
| 8.882 | 0.651 |
| 10.170 | 0.688 |
| 11.459 | 0.712 |
| 12.741 | 0.722 |
| 14.024 | 0.726 |

In the preferred embodiment of the present invention, the air and carbon dioxide gas, exiting from the exhaust aperture 132 of the exhaust nozzle 100 has a temperature of approximately $-150°$ F. and a velocity of approximately 1700 feet per second. The output mixture is approximately 10% by mass of solid $CO_2$ snow which has a mean particle size of approximately 100 micrometers. The exhaust nozzle 100 was designed for an inlet pressure of approximately 100 psi and produces and exit flow Mach number of approximately 1.92. The $CO_2$ snow exits at a velocity of approximately 600 feet per second with a generally uniform distribution. The exhaust aperture 132 is designed to be approximately 2 to 6 inches from the workpiece 90. The exhaust gases and snow exiting from the exhaust aperture 132 are generally parallel to the longitudinal axis of the nozzle 100 and do not substantially diverge. While the particle size of the $CO_2$ snow exiting the nozzle 70 is only about 0.0005 to 0.001 inches, as a result of the coagulation and agglomeration process within the elongated cavity 64 the size of the $CO_2$ particles exiting the exhaust nozzle 100 is approximately 0.004 to 0.006 inches. The angle of attack of the snow against the workpiece 90 can be varied from 0° to 90°, with an angle of attack of approximately 30° to 60° being the best for most operations.

Figure 4:
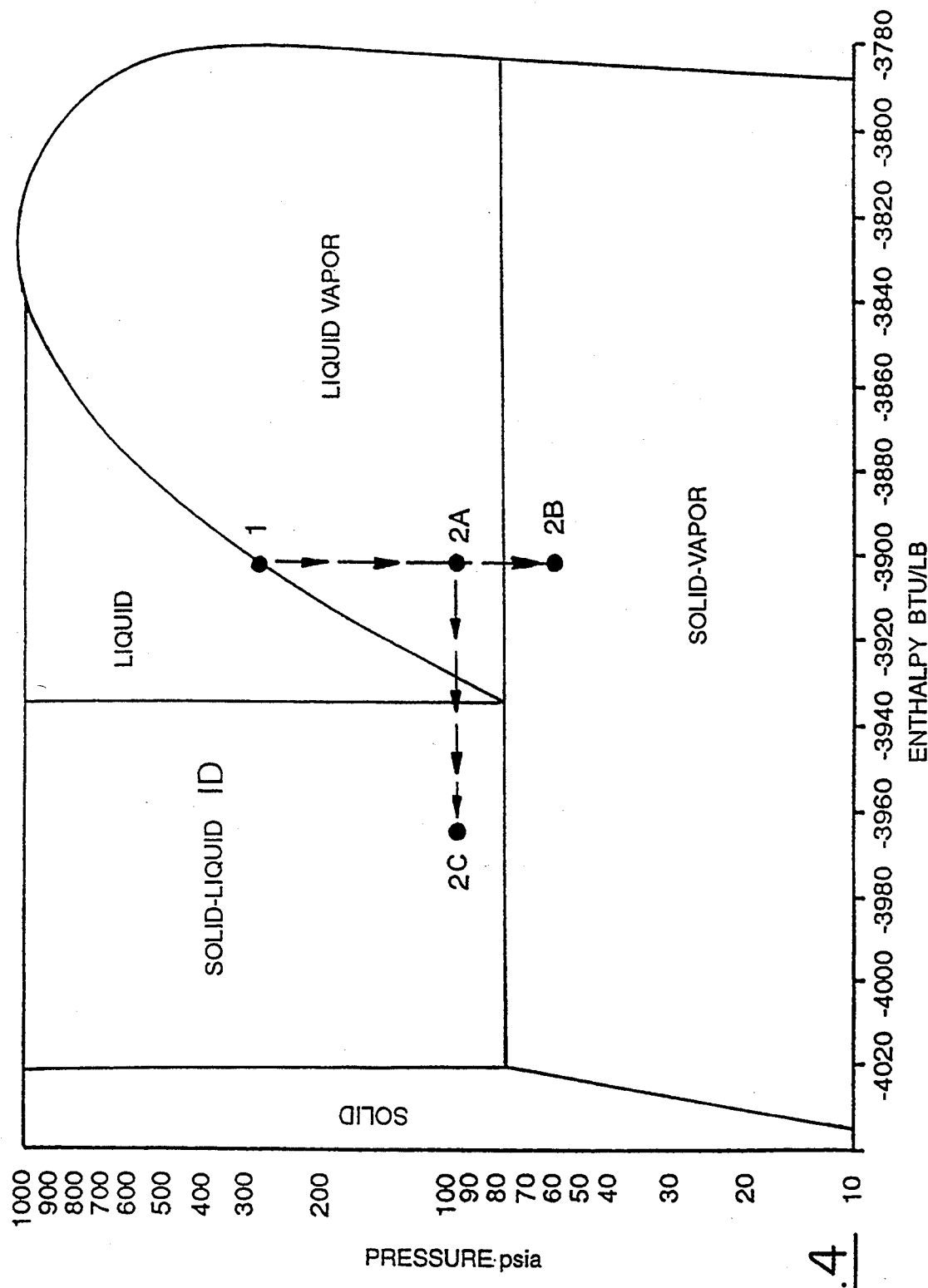
FIG. 4 is an enthalpy diagram showing the transition or flashing of the liquid $CO_2$ into snow in accordance with the operation of the method of the present invention.

The method of operation of the $CO_2$ cleaning system will now be explained. Assuming a shop air pressure of approximately 85 psi and an ambient temperature of approximately 75° F., the effect of controlling the pressure and temperature of the gaseous mixture of air and liquid $N_2$ into the mixer 50 can be illustrated with reference to FIG. 4. Point 1 on FIG. 4 represents the state of the saturated liquid $CO_2$ within the nozzle 70 which is controlled by the controller 22 at a pressure of 300 psi and a temperature of approximately 0° F. Point 2A represents a pressure of 100 psi and indicates the state of the $CO_2$ after flashing through the orifices 72 in the injector nozzle 70. The $CO_2$ exiting the nozzle 70 comprises $CO_2$ in both the liquid and gaseous phase having a temperature of approximately $-40°$ F. If the pressure of the shop air in the cavity 64 is adjusted to approximately 60 psi instead of 100 psi at point 2B, then the resulting $CO_2$ exiting from the nozzle 70 will be a combination of solid and vapor, and the temperature of the resulting combination will be approximately $-80°$ F. Therefore, the relative levels of liquid and gaseous $CO_2$ produced in conjunction with the $CO_2$ snow can be controlled by adjusting the pressure of the air in the cavity 64. If the air and Nitrogen mixture exiting from the mixer 50 is maintained at a temperature of approximately $-50°$ F., this would cool the $CO_2$ mixture exiting the injector nozzle 70 so that the resulting mixture would be represented by point 2C on FIG. 4, which corresponds to a mixture of solid and liquid phase $CO_2$. Thus, the composition of the $CO_2$ mixture within the cavity 64 can be controlled by adjusting the pressure or the temperature of the air within the cavity 64, or both. The elongated shape of the cavity 64 allows sufficient length for the coagulation of the $CO_2$ snow into larger particles before it enters the exhaust nozzle 100.

During the injection of the liquid $CO_2$ through the injector nozzle into the cavity 64, a boost of up to 15 psi in the pressure within the cavity is obtained because of the partial conversion of the liquid $CO_2$ into vapor. This increase in pressure results in an increase in the particle speeds exiting the nozzle 100 by about 10 percent, which further improves the efficiency of the cleaning process.

The inlet pressure at the cylindrical section 110 of the exhaust nozzle 100 can be varied from 40 to 300 psi, although in the preferred embodiment the pressure is designed to be from 60 to 100 psi with a temperature of between $-40$ to $-100°$ F. The pressure at the exhaust aperture 132 of the exhaust nozzle 130 is designed to be at-atmospheric pressure, while the exit temperature is estimated to be approximately −200° F. The percentage of solid to gaseous $CO_2$ entering the exhaust nozzle 100 is estimated to be about 10–40%.

The $CO_2$ snow produced by the first preferred embodiment of the present invention was directed at a Koki rosin baked pallet (8″ by 14″) of the type used in wave-soldering applications. The pallet had a coating of baked Koki rosin flux of approximately 0.005 inches in thickness, and had been through numerous wave-soldering cycles in a manufacturing environment. At a shop air pressure of 85 psi, the Koki rosin flux was completely cleaned from the pallet in about 30 seconds, whereas commercially available $CO_2$ cleaning systems were not able to remove the accumulated flux in a similar period of time. In a similar manner, a 3 inch by 3 inch face of an FR4 printed circuit board of the type used in a speedometer assembly was coated with a combination of fluxes (including Koki) to a depth of approximately 0.003 inches and then was cleaned in approximately 5–10 seconds using the present invention. Finally, an 8 inch by 10 inch glue-plate application fixture of the type used in an electronic manufacturing assembly process was coated with approximately 0.05 inches of rosin glue and then was cleaned in approximately 120 seconds using the present invention. This performance is at least comparable to, if not better than, common available systems utilizing compacted $CO_2$ pellets.

If the pressure of the shop air is increased from 85 psi to approximately 250 psi, then the present invention could be operated in approximately the same manner, except that direct conversion liquid $CO_2$ snow nozzle, $CO_2$ conversion efficiencies may be somewhat reduced. However, the system would be more expensive because the lower cost shop air equipment could not be used.

While the present invention has been particularly described in terms of specific embodiments thereof, it will be understood that numerous variations of the invention are within the skill of the art and yet are within the teachings of the technology and the invention herein. Accordingly, the present invention is to be broadly construed and limited only by the scope and spirit of the following claims.

I claim:

1. An apparatus for cleaning a workpiece with abrasive $CO_2$ snow, comprising in combination:
   a nozzle for receiving and expelling liquid $CO_2$ through an orifice sized for directly converting the liquid $CO_2$ into $CO_2$ snow,
   a body defining a cavity therein, with said nozzle being coupled to said body for ejecting the $CO_2$ snow into said cavity,
   an exhaust nozzle coupled to said body and said cavity therein for directing the $CO_2$ snow toward the workpiece, and
   mixing means for receiving and mixing pressurized shop air at ambient temperature with liquid $N_2$ in portions for precooling the shop air to at least 0 degrees F., said mixing means being coupled to said body for directing the cooled shop air into said cavity for cooling the area adjacent to said orifice in said nozzle and for exhausting the $CO_2$ through said exhaust nozzle under pressure, whereby the cooled mixture of shop air and gaseous $N_2$ enhances the efficiency of the direct conversion of the liquid $CO_2$ into $CO_2$ snow particles.

2. The apparatus as described in claim 1 wherein said mixing means directs the resulting mixture of $N_2$ and shop air onto said nozzle near said orifice therein for creating turbulence within said cavity for improving the mixture and distribution of the $CO_2$ snow exiting said exhaust nozzle.

3. The apparatus as described in claim 1 wherein said mixing means directs the resulting mixture of $N_2$ and shop air onto said nozzle near said orifice therein for at least partially removing the latent heat generated by the conversion of liquid $CO_2$ into $CO_2$ snow.

4. The apparatus as described in claim 1 wherein the shape and cross-section of said exhaust nozzle maintains the pressure of the $CO_2$ and the mixture of shop air and $N_2$ therein to at least 40 psi, while exhausting the $CO_2$ snow toward the workpiece.

5. The apparatus as described in claim 1 wherein the pressure of the liquid $CO_2$ within said cavity defined within said nozzle is at least 200 psi.

6. The apparatus as described in claim 5 wherein the temperature of the liquid $CO_2$ within said cavity in said nozzle is less than 0° F.

7. The apparatus as described in claim 1 wherein the length to diameter ratio of said cavity is greater than 10.

8. The apparatus as described in claim 1 wherein the $CO_2$ snow is mixed with shop air and gaseous $N_2$ and $CO_2$ passing out of the exhaust nozzle in the approximate ration of 5 to 1 by mass.

9. A method for cleaning a workpiece with abrasive $CO_2$ snow, comprising the steps of:
   receiving $CO_2$ in a liquid form at a first pressure and temperature,
   passing the liquid $CO_2$ through an orifice in a nozzle for directly converting at least a portion of the liquid $CO_2$ into $CO_2$ snow,
   collecting the $CO_2$ now within an elongated cavity for enhancing the coagulation of the $CO_2$ snow into snow particles and then passing the $CO_2$ snow and snow particles through an exhaust nozzle having a contour for directing the flow toward the workpiece,
   mixing shop air, at ambient temperature and a pressure of less than 100 psi, with liquid $N_2$ for cooling the resulting gaseous mixture, and
   injecting the cooled mixture of shop air and $N_2$ into the elongated cavity adjacent the nozzle for improving the conversion efficiency of the liquid $CO_2$ into snow particles by decreasing the temperature adjacent to the nozzle, and for exhausting the snow particles under pressure through said exhaust nozzle.

10. The method as described in claim 9 wherein the injecting step includes the additional step of directing the mixture of shop air and $N_2$ onto an area of the nozzle operatively adjacent to the orifice therein for removing latent heat resulting from the flashing of the $CO_2$ from liquid to snow.

11. The method as described in claim 9 wherein the step of passing the $CO_2$ snow and gas mixture through the exhaust nozzle further includes the step of accelerating the mixture to a speed of at least Mach 1.0.

12. The method as described in claim 9 further including the step of generating a mixture of exhausted $CO_2$ gas and snow in the approximate ratio of 0.4 to 1 by mass.

13. An apparatus for cleaning a workpiece with abrasive $CO_2$ snow, comprising in combination:
   a nozzle for receiving and expelling liquid $CO_2$ through an orifice sized for directly converting the liquid $CO_2$ into $CO_2$ snow, a body defining an elongated cavity therein, with said nozzle being coupled to said body for ejecting the $CO_2$ snow into said elongated cavity, an exhaust nozzle coupled into said elongated cavity of said body for directing the $CO_2$ snow from said elongated cavity toward the workpiece, and first means coupled to said body for receiving and directing pressurized air at a known temperature into said elongated cavity in the area adjacent to said orifice in said nozzle for enhancing the conversion efficiency of generating the $CO_2$ snow, for enhancing the coagulation of the $CO_2$ snow into larger $CO_2$ snow particles within said elongated cavity, and for exhausting under pressure the $CO_2$ snow and particles out through said exhaust nozzle, whereby the pressurized air enhances the efficiency of generating the $CO_2$ snow particles.

14. The apparatus as described in claim 13 wherein said elongated cavity has a length to diameter ratio of greater than 10.

15. The apparatus as described in claim 14 wherein said first means includes mixing means for receiving and mixing liquid. $N_2$ from a source thereof with the pressurized air and directing the resulting precooled mixture into said elongated cavity adjacent said nozzle and said orifices therein for creating turbulence within said elongated cavity for improving the mixture and coagulation of the snow exiting said exhaust nozzle.

16. The apparatus as described in claim 13 wherein said mixing means directs the resulting mixture of $N_2$ and shop air onto said nozzle near said orifices therein for at least partially removing the latent heat generated by the conversion of liquid $CO_2$ into snow.

17. A method for cleaning a workpiece with abrasive $CO_2$ snow, comprising the steps of:

receiving liquid $CO_2$ at a first pressure and temperature, passing the liquid $CO_2$ through an orifice in a nozzle for directly converting at least a portion of the $CO_2$ from the liquid phase into $CO_2$ snow, coagulating the $CO_2$ snow within an elongated cavity to form $CO_2$ snow particles, passing the $CO_2$ snow and $CO_2$ snow particles through an exhaust nozzle having a contour for directing the flow toward the workpiece, injecting shop air into the elongated cavity adjacent the nozzle for agitating the $CO_2$ snow to enhance coagulation of the $CO_2$ snow particles, and for exhausting under pressure the $CO_2$ snow particles through the exhaust nozzle.

* * * * *